(12) United States Patent
Li et al.

(10) Patent No.: US 10,416,508 B2
(45) Date of Patent: Sep. 17, 2019

(54) ARRAY SUBSTRATE AND DISPLAY PANEL, AND FABRICATION METHODS THEREOF

(71) Applicant: BOE TECHNOLOGY GROUP CO., LTD., Beijing (CN)

(72) Inventors: Hui Li, Beijing (CN); Yunsik Im, Beijing (CN); Hyunsic Choi, Beijing (CN); Liwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/564,938

(22) PCT Filed: May 15, 2017

(86) PCT No.: PCT/CN2017/084280
§ 371 (c)(1),
(2) Date: Oct. 6, 2017

(87) PCT Pub. No.: WO2018/010481
PCT Pub. Date: Jan. 18, 2018

(65) Prior Publication Data
US 2018/0307080 A1  Oct. 25, 2018

(30) Foreign Application Priority Data
Jul. 15, 2016  (CN) .......................... 2016 1 0563174

(51) Int. Cl.
*G02F 1/1343* (2006.01)
*G02F 1/1337* (2006.01)
(Continued)

(52) U.S. Cl.
CPC .......... *G02F 1/13439* (2013.01); *G02F 1/136* (2013.01); *G02F 1/1343* (2013.01);
(Continued)

(58) Field of Classification Search
CPC ........... G02F 1/13439; G02F 1/133707; G02F 1/1343; G02F 1/134309; G02F 1/136;
(Continued)

(56) References Cited

U.S. PATENT DOCUMENTS

2002/0131005 A1\* 9/2002 Yang ................. G02F 1/134363
349/141
2009/0059150 A1 3/2009 Lee
(Continued)

FOREIGN PATENT DOCUMENTS

CN  1388403 A   1/2003
CN  101025528 A  8/2007
(Continued)

OTHER PUBLICATIONS

First Office Action in the Chinese Patent Application No. 201610563174.8, dated Jun. 20, 2018; English translation attached.
(Continued)

*Primary Examiner* — Nathanael R Briggs
(74) *Attorney, Agent, or Firm* — Intellectual Valley Law, P.C.

(57) ABSTRACT

Array substrate, display panel, and display device, and their fabrication methods are provided. An array substrate includes a plurality of subpixels, each including a first electrode and a second electrode, electrically isolated from one another, on a substrate. The first electrode includes a plurality of electrically connected first electrode strips. The second electrode includes a plurality electrically connected second electrode strips alternately arranged with the first electrode strips. A first distance along a first direction at any position between one first electrode strip and a first neighboring second electrode strip is substantially same. Along a
(Continued)

length direction of the first electrode strips, a first width of each first electrode strip has a varying value at a different position.

19 Claims, 10 Drawing Sheets

(51) Int. Cl.
    *H01L 21/84*      (2006.01)
    *H01L 27/12*      (2006.01)
    *G02F 1/136*      (2006.01)
    *G02F 1/1362*      (2006.01)

(52) U.S. Cl.
    CPC .. *G02F 1/133707* (2013.01); *G02F 1/134309* (2013.01); *H01L 21/84* (2013.01); *H01L 27/12* (2013.01); *G02F 1/1362* (2013.01); *G02F 2201/122* (2013.01); *G02F 2201/123* (2013.01)

(58) Field of Classification Search
    CPC ............. G02F 1/1362; G02F 2201/122; G02F 2201/123; G02F 2001/134372; G02F 1/134363; H01L 21/84; H01L 27/12
    See application file for complete search history.

(56) References Cited

U.S. PATENT DOCUMENTS

| 2009/0173942 A1 | 7/2009 | Hsiao et al. |
| 2011/0199568 A1 | 8/2011 | Morishita et al. |
| 2018/0083038 A1 | 3/2018 | Li et al. |

FOREIGN PATENT DOCUMENTS

| CN | 102187270 A | 9/2011 |
| CN | 103676353 A | 3/2014 |
| CN | 203825339 U | 9/2014 |
| CN | 104330933 A | 2/2015 |
| CN | 105487307 A | 4/2016 |
| CN | 106129065 A | 11/2016 |
| JP | 2009116027 A | 5/2009 |

OTHER PUBLICATIONS

International Search Report & Written Opinion dated Jul. 27, 2017, regarding PCT/CN2017/084280.

\* cited by examiner

ARRAY SUBSTRATE AND DISPLAY PANEL, AND FABRICATION METHODS THEREOF

CROSS-REFERENCE TO RELATED APPLICATION

This application is a national stage application under 35 U.S.C. § 371 of International Application No. PCT/CN2017/084280, filed May 15, 2017, which claims priority to Chinese Patent Application No. 201610563174.8, filed Jul. 15, 2016, the contents of which are incorporated by reference in the entirety.

TECHNICAL FIELD

The present disclosure generally relates to display technologies and, more particularly, relates to an array substrate and fabrication method thereof, and a display panel including the array substrate.

BACKGROUND

With the development of liquid erg seal display (LCD) technology, thin film transistor liquid crystal display (TFT-LCD) monitors have been widely used in various fields.

A TFT-LCD includes a display panel. The display panel further includes an array substrate, a liquid crystal layer, and a counter substrate. Moreover, a plurality of common electrodes and a plurality of pixel electrodes may be formed on the array substrate. According to existing technology, the common electrodes and the pixel electrodes on the array substrate may be formed by a method including using a deposition process or a sputtering process to form a conductive him, forming a photoresist layer on the conductive film, using a mask plate to pattern the photoresist layer, and then etching the conductive film using the patterned photoresist layer as an etching mask to form the patterned common electrodes and/or pixel electrodes.

However, the existing fabrication process to display panels may often generate critical dimension (CD) bias, and further lead to non-uniform display brightness.

The disclosed array substrate and fabrication methods as well as the disclosed display panel are directed to at least partially alleviate one or more problems set forth above and to solve other problems in the art.

SUMMARY

The present disclosure provides an array substrate, a display panel, and a display device, and fabrication methods thereof.

One aspect of the present disclosure provides an array substrate. The array substrate includes a plurality of subpixels, each including a first electrode and a second electrode, electrically isolated from one another, on a substrate. The first electrode includes a plurality of electrically connected first electrode strips; the second electrode includes a plurality electrically connected second electrode strips; the first electrode strips and the second electrode strips are alternately arranged; a first distance along a first direction at any position between one first electrode strip and a first neighboring second electrode strip is substantially same, and a second distance along a second direction, opposite to the first direction, at any position between the one first electrode strip and a second neighboring second electrode strip is substantially same; and along a length direction of the first electrode strips, a first width of each first electrode strip has a varying value at a different position, and along a length direction of the second electrode strips, a second width of the second electrode strip has a different value at a different position.

Optionally, the first width of each first electrode strip includes a first base value M, and along the length direction of the first electrode strip, the first width includes the first base value M plus a first deviation range; and the second width of each first electrode strip includes a second base value N, and along the length direction of the second electrode strip, the second width includes the second base value N plus a second deviation range.

Optionally, the first base value M is in a range of approximately 3.1±1.5 µm, and along the length direction of the first electrode strip, the first width varies in a range within M±0.5 µm; the second base value N is in a range of approximately 2.1±0.5 µm, and along the length direction of the second electrode strip, the second width varies in a range N±0.5 µm; and the first base value M is greater than the second base value N.

Optionally, the first base value M is 3.1 µm, and along the length direction of the first electrode strip, the first width varies in a range within (3.1±03) µm; and the second base value N is 2.1 µm, and along the length direction of the second electrode strip, the second width varies in a range within (2.1±0.3) µm. Each first electrode strip is divided into 9 segments with each having a same length, wherein the 1st, 3rd, 5th, 7th, and 9th segments of the first electrode strip have a same width equal to the first base value M, and widths of the 2nd, 4th, 6th, and 8th segments are sequentially increased by 0.2 µm starting from (M−0.3) µm. Each second electrode strip is divided into 9 segments with each having a same length, wherein the 1st, 3rd, 5th, 7th, and 9th segments of the second electrode strip have a same width equal to the second base value N, and widths of the 2nd, 4th, 6th, and 8th segments are sequentially decreased by 0.2 µm starting from (N+0.3) µm.

Optionally, each of the first direction and the second direction is perpendicular to the length direction of the first electrode strips.

Optionally, each subpixel includes a first domain and a second domain.

Optionally, in the first domain, the first distance is greater than the second distance, and in the second domain, the first distance is smaller than the second distance.

Optionally, in the first domain, for a portion of the first electrode strips and the second electrode strips, the first distance is greater than the second distance, and for a rest portion of the first electrode strips and the second electrode strips, the first distance is smaller than the second distance, and in the second domain, for a portion of the first electrode strips and the second electrode strips, the first distance is greater than the second distance, and for a rest portion of the first electrode strips and the second electrode strips, the first distance is smaller than the second distance.

Optionally, each subpixel further includes: a third domain mirror symmetrical to the first domain, and a fourth domain mirror symmetrical to the second domain.

Optionally, in the first domain and the second domain, a number of the first electrode strips and the second electrode strips with the first distance greater than the second distance is equal to a number of the first electrode strips and the second electrode strips with the first distance smaller than the second distance.

Optionally, any neighboring subpixels include a first domain and a second domain, respectively; and in the first domain, the first distance is greater than the second distance, and in the second domain, the first distance is smaller than the second distance; and Optionally, any neighboring subpixels include a first domain and a second domain, respectively; and in the first domain, for a portion of the first electrode strips and the second electrode strips, the first distance is greater than the second distance, and for a rest portion of the first electrode strips and the second electrode strips, the first distance is smaller than the second distance, and in the second domain, for a portion of the first electrode strips and the second electrode strips, the first distance is greater than the second distance, and for a rest portion of the first electrode strips and the second electrode strips, the first distance is smaller than the second distance.

Optionally, in the first domain and the second domain, a number of the first electrode strips and the second electrode strips with the first distance greater than the second distance is equal to a number of the first electrode strips and the second electrode strips with the first distance smaller than the second distance.

Another aspect of the present disclosure provides a display panel including the disclosed array substrate.

Another aspect of the present disclosure provides a display device including the disclosed display panel.

Another aspect of the present disclosure provides a method for fabricating an array substrate, by forming a plurality of subpixels, each including a first electrode and a second electrode, electrically isolated from each other, on a substrate. The first electrode includes a plurality of electrically connected first electrode strips; the second electrode includes a plurality electrically connected second electrode strips; the first electrode strips and the second electrode strips are alternately arranged; a first distance S1 along a first direction at any position between one first electrode strip and a first neighboring second electrode strip is substantially same, and a second distance S2 along a second direction, opposite to the first direction, at any position between the one first electrode strip and a second neighboring second electrode strip is substantially same; and along a length direction of the first electrode strips, a first width of each first electrode strip has a varying value at a different position, and along a length direction of the second electrode strips, a second width of the second electrode strip has a different value at a different position.

Optionally, the first width of each first electrode strip includes a first base value M, and along the length direction of the first electrode strip, the first width includes the first base value M plus a first deviation range; and the second width of each first electrode strip includes a second base value N, and along the length direction of the second electrode strip, the second width includes the second base value N plus a second deviation range.

Optionally, the first electrode is a common electrode and the second electrode is a pixel electrode.

Optionally, the method further includes forming a gate line, a common electrode line in a same layer as the gate line, a data line, and an auxiliary metal line in a same layer as the data line for each subpixel, wherein the common electrode is electrically connected to the common electrode line and the auxiliary metal line.

Optionally, forming the gate line, the common electrode line, the data line, the auxiliary metal line, the common electrode, and the pixel electrode further includes: forming the gate line and the common electrode line parallel to the gate line on the substrate; forming a first isolation layer with a first via hole exposing the common electrode line on the substrate; forming the common electrode on the first isolation layer, wherein the common electrode is electrically connected to the common electrode line through the first via hole formed in the first isolation layer; forming a second isolation layer with a second via hole exposing the common electrode on the substrate; forming a semiconductor layer and a drain electrode as well as the data line and the auxiliary metal line parallel to the data line on the second isolation layer, wherein the auxiliary metal layer is electrically connected to the common electrode through the second via hole formed in the second isolation layer; forming a passivation layer with a third via hole above the drain electrode; and forming the pixel electrode on the passivation layer, wherein the pixel electrode is electrically connected to the drain electrode through the third via hole formed in the passivation layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Critical dimension (CD) bias generated when forming a display panel may often lead to non-uniform display brightness of the display panel.

Figure 1:
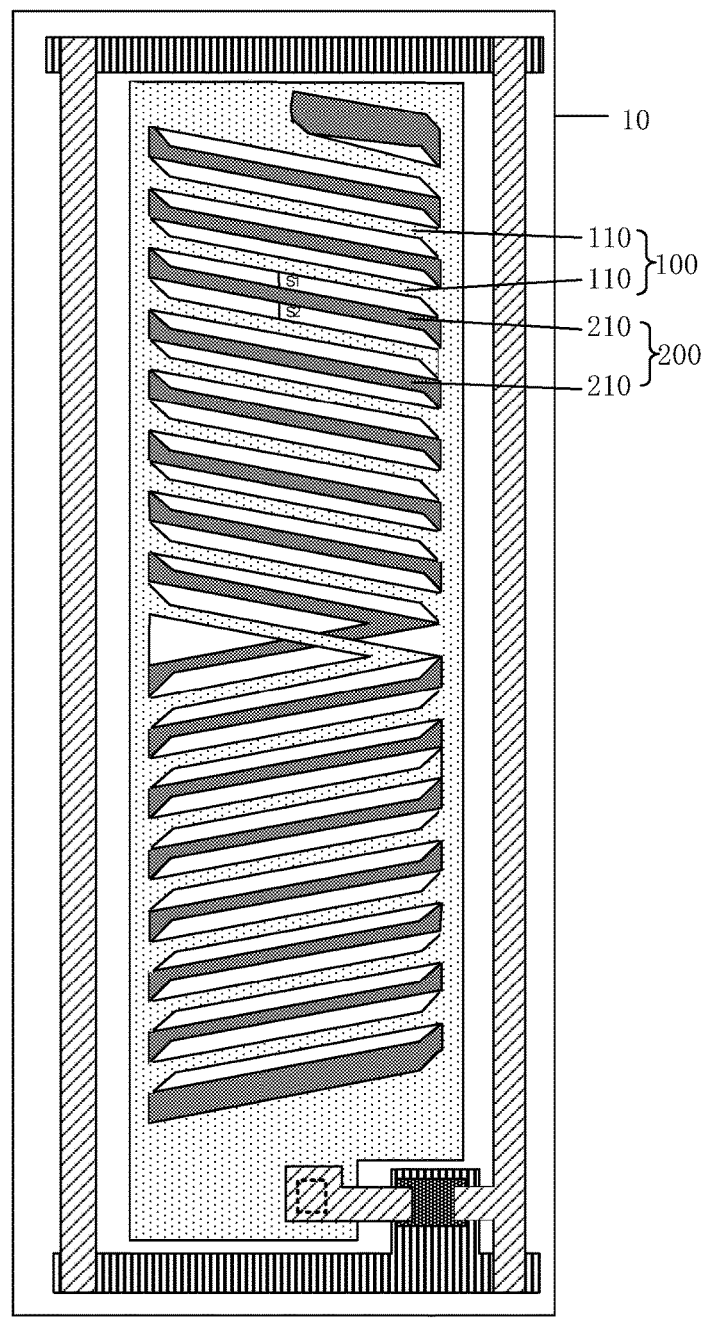
FIG. 1 illustrates a schematic view of an existing array substrate.

FIG. 1 illustrates an existing method for fabricating the common electrodes and the pixel electrodes. Referring to FIG. 1, each common electrode 200 formed on the substrate 10 is divided into a plurality of electrically connected common electrode strips 210, and each pixel electrode 100 formed on the substrate 10 is also divided into a plurality of electrically connected pixel electrode strips 110. Moreover, the plurality of common electrode strips 210 have an identical width and the plurality of pixel electrode strips 110 also have an identical width. In addition, the distance between a common electrode strip 210 and a first neighboring pixel electrode strip 110, e.g. S1, is equal to the distance between the common electrode strip 210 and a second neighboring pixel electrode strip 110, e.g. S2. That is, S1=S2 as shown in FIG. 1.

However, the existing fabrication process may often generate CD bias. That is, the actually fabricated width of the electrode strip may deviate from the expected width of the electrode strip. Therefore, the actual distance between a common electrode strip 210 and a neighboring pixel electrode strip 110 may deviate from the expected distance between the common electrode strip 210 and the pixel electrode strip 110. As such, the electric field between each common electrode 200 and the corresponding pixel electrode 100 may not be uniform, and thus the brightness of the entire display panel may not be uniform.

Figure 2A:
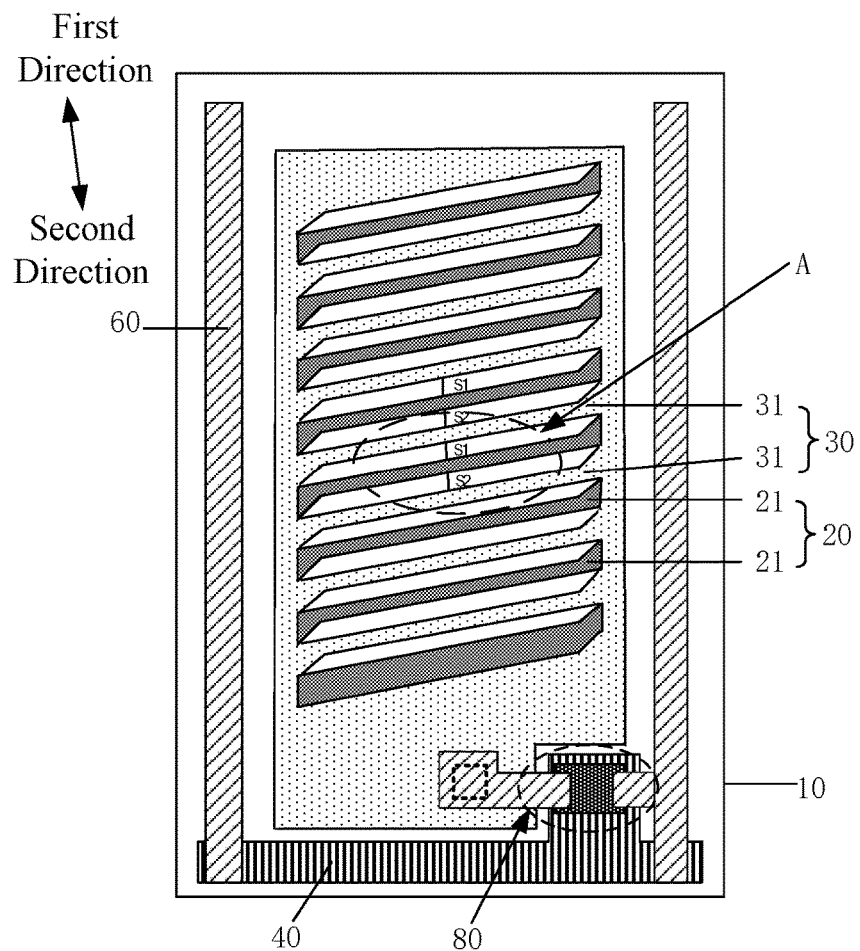
FIG. 2A illustrates a schematic view of an exemplary array substrate according to various disclosed embodiments.

The present disclosure provides an array substrate. FIG. 2A illustrates an exemplary array substrate according to various disclosed embodiments of the present disclosure. For illustration purpose, FIG. 2A only shows one subpixel although the array substrate may include a plurality of subpixels.

The subpixel may include a first electrode 20 and a second electrode 30 disposed on a substrate 10. The first electrode 20 may be electrically isolated from the second electrode 30. The first electrode 20 may further include a plurality of first electrode strips 21 and the second electrode 30 may include a plurality of second electrode strips 31. When being orthographically projected on the substrate 10, the plurality of first electrode strips 21 and the plurality of second electrode strips 31 may be alternately arranged and substantially in parallel with each other. Further, the distance between each first electrode strip 21 and the neighboring second electrode strip 31 along a first direction may be S1 at any position of the first electrode strip; while the distance between each first electrode strip 21 and the neighboring second electrode strip 31 along a second direction may be S2 at any position of the first electrode strip. The first direction and the second direction may be two opposite directions.

Figure 2B:
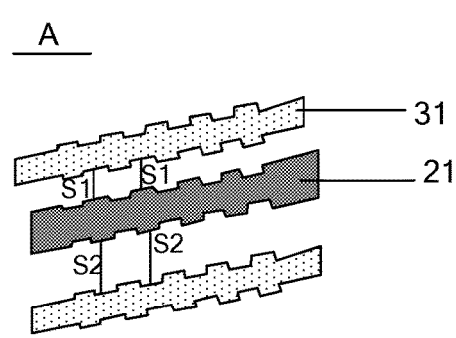
FIG. 2B illustrates an enlarged schematic view of part A of the array substrate shown in FIG. 2A.

FIG. 2B illustrates an enlarged schematic view of part A of the array substrate shown in FIG. 2A. Referring to FIG. 2B, along the length direction of the first electrode strips 21, the width of each first electrode strip 21 may have different values at different positions. Also, along the length direction of the second electrode strips 31, the width of each second electrode strip 31 may have different values at different positions.

Returning back to FIG. 2A, the array substrate may also include a plurality of gate lines 40, a plurality of data lines 60, and a plurality of thin film transistors (TFTs) 80 arranged in the plurality of subpixels. Of course, the array substrate also includes a plurality of common electrodes (not shown). Each TFT 80 may be an amorphous silicon based TFT, a polycrystalline silicon based TFT, a metal oxide based TFT, an organic TFT, or any other type TFT. The TFT 80 may be bottom-gate type or top-gate type.

Figure 3:
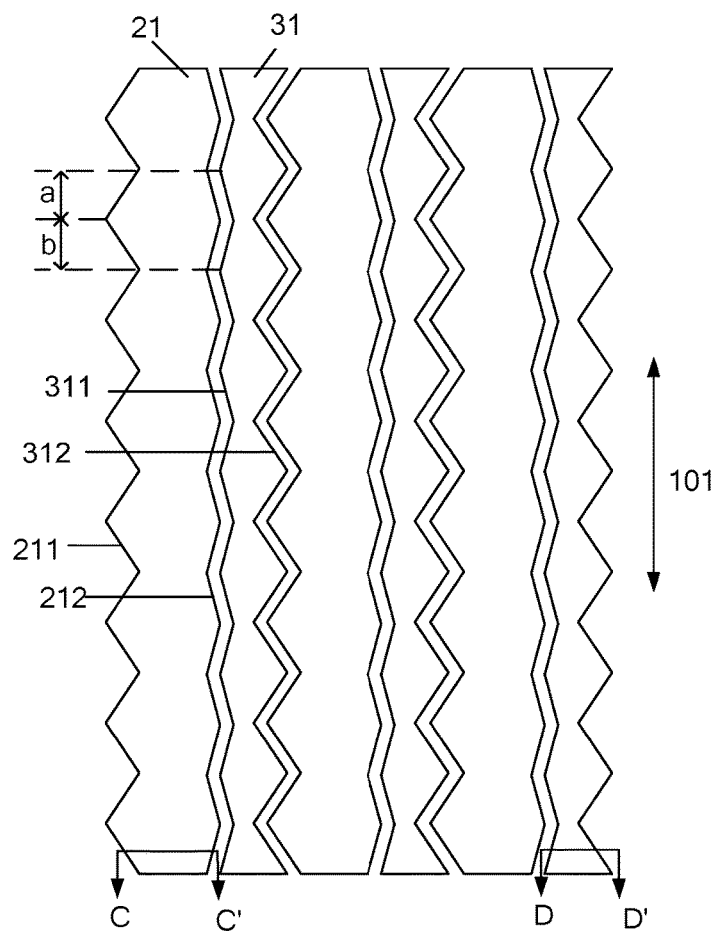
FIG. 3 illustrates a schematic view of another exemplary array substrate according to various disclosed embodiments.

FIG. 3 illustrates another exemplary array substrate according to various disclosed embodiments of the present disclosure. For illustration purpose, FIG. 3 merely shows one subpixel although the array substrate may include any number of subpixels.

The subpixel in FIG. 3 may include a first electrode, including include a plurality of first electrode strips 21, and a second electrode, including a plurality of second electrode strips 31, disposed on a substrate. The first electrode may be electrically isolated from the second electrode. The plurality of first electrode strips 21 and the plurality of second electrode strips 31 may be alternately arranged and substantially in parallel with each other along a first direction 101, such as a length direction of the electrode strips, as shown in FIG. 3.

Further, the distance between any first electrode strip 21 and the neighboring second electrode strip 31 along a second direction perpendicular to the first direction 101 may be substantially same or similar with a certain range. For example, distances between each first electrode strip 21 and the neighboring second electrode strip 31 at any positions of the first electrode strip 21 may be a base value having a suitable, reference deviation range, e.g., between a positive value and a negative value.

Along the first direction 101, one or both sides of first electrode strips 21 may be Σ-shaped or otherwise zigzagged. Accordingly, one or both sides of second electrode strips 31 may be Σ-shaped or otherwise zigzagged. In this manner, widths, e.g., along c-c' direction, at different positions of any first electrode strip 21 may have different values, and widths, e.g., along c-c' direction, at different positions of any second electrode strip 31 may have different values, while distances, at different positions, between any first electrode strip 21 and its neighboring second electrode strip 31 along the second direction perpendicular to the first direction 101 may be substantially same or similar within a certain range.

Figure 4:
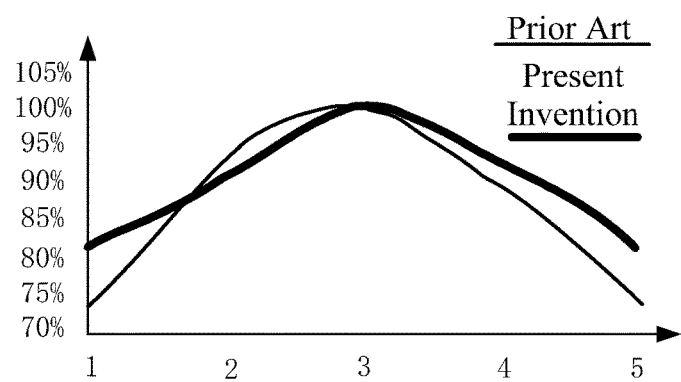
FIG. 4 illustrates a simulation of the correlation between the CD bias and the transmission rate of the liquid crystals in an array substrate according to various disclosed embodiments.

FIG. 4 illustrates a simulation of the correlation between the CD bias of the electrode strips and the transmission rate of the liquid crystals in the array substrate. Specifically, FIG. 4 shows the correlation between the transmission rate of the liquid crystals and the CD biases of the first electrode strips 21 and the second electrode strips 31 when the CD biases of the first electrode strips 21 and the second electrode strips 31 are ±0.3 μm. The vertical axis in FIG. 4 may represent the transmission rate of the liquid crystals (i.e. the emission rate of light). Moreover, along the horizontal axis, 1 may represent a point where the CD biases of the first electrode strips 21 and the second electrode strips 31 are both −0.3 μm, 2 may represent a point where the CD bias of the first electrode strips 21 is −0.3 μm and the CD bias of the second electrode strips 31 is +0.3 μm, 3 may represent a point where the CD biases of the first electrode strips and the second electrode strips 31 are both 0.4 may represent a point where the CD bias of the first electrode strips 21 is +0.3 μm and the CD bias of the second electrode strips 31 is −0.3 μm, and 5 may represent a point where the CD biases of the first electrode strips 21 and the second electrode strips 31 are both +0.3 μm.

Further, the thinner curve in FIG. 4 may represent the corresponding transmission rate of the liquid crystals when the fabrication process of the electrode strips, according to existing technology, results in CD biases of ±0.3 μm, and the thicker curve may represent the corresponding transmission rate of the liquid crystals when the fabrication process of the electrode strips, according to present disclosure, results in CD biases of ±0.3 µm. Referring to FIG. 4, when the CD biases are ±0.3 µm, the variation range of the transmission rate of the liquid crystals according to present disclosure is smaller than the variation range of the transmission rate of the liquid crystals according to exiting technology. Specifically, the transmission rate of the liquid crystal may variate in a range between approximately 83% and 100%.

Although FIG. 4 only shows the correlation between the transmission rate of the liquid crystals and the CD biases of the first electrode strips 21 and the second electrode strips 31 when the CD biases are ±0.3 µm, the structures provided in various embodiments of the present disclosure may all be able to reduce the variation range of the transmission rate of the liquid crystals when the CD biases are in a range of approximately ±0.2 µm to approximately ±0.5 µm.

Further, the first electrodes 20 and the second electrodes 30 may or may not be formed in a same layer. As an example, the first electrodes 20 and the second electrodes 30 are formed in different layers in the reference figures corresponding to various embodiments of the present disclosure. In other embodiment, the first electrodes 20 and the second electrodes 30 may be formed in a same layer.

Moreover, the first electrodes 20 and the second electrode 30 may both be transparent electrodes. Further, the first electrodes 20 may be common electrodes or pixel electrodes. As an example, the first electrodes 20 are described as common electrodes in the reference figures corresponding to various embodiments of the present disclosure. In addition, the material used to form the first electrodes 20 and the second electrodes 30 may be any appropriate transparent conductive material, such as indium tin oxide (ITO).

Further, the first direction and the second direction may not be specifically defined. As long as that along the first direction, a second electrode strip 31 is on one side of each first electrode strip 21 adjacent to the first electrode 21, and along the second direction opposite to the first direction, another second electrode strip 31 is on the other side of the first electrode 21 adjacent to the first electrode 21, the definition of the first direction and the second direction may then be consistent with various embodiments of the present disclosure.

Moreover, the distance between a first electrode strip 21 and a neighboring second electrode strip 31 at any position may refer to the distance between the first electrode strip 21 and the neighboring second electrode strip 31 along any line perpendicular the both the first electrode strip 21 and the second electrode strip 31, that is, the shortest dimension between the first electrode strip 21 and the neighboring second electrode strip 31.

Further, all first electrode strips 21 of each first electrode 20 may have an identical shape, and thus along any line perpendicular to the first electrode strips 21, the first electrode strips 21 in the first electrode 20 may all have a same width. Similarly, all second electrode strips 31 of each second electrode 30 may also have an identical shape, and thus along any line perpendicular to the second electrode strips 31, the second electrode strips 31 in the second electrode 30 may also have a same width.

Further, referring to FIG. 2B, the first electrode strips 21 may have an appropriately larger width at certain positions as compared to other position, and accordingly, the second electrode strips 31 at corresponding positions may have a smaller width. Moreover, the second electrode strips 21 may have a smaller width at other positions, and accordingly, the second electrode strips 31 at corresponding positions may have a larger width. As such, an identical distance at any position between the first electrode strip 21 and a neighboring second electrode strip 31 may be ensured.

Further, because the width of each electrode strip may be different from position to position, the electrode strip may then be defined as X short segments with each segment having in identical length. The width of each segment may be different from the width of the neighboring segments. Moreover, the number of the segments, X, may not be specifically defined, and thus may have any appropriate value.

According to the disclosed array substrate, each first electrode 20 of the array substrate may include a plurality of electrically connected first electrode strips 21, and each second electrode 30 of the array substrate may include a plurality of electrically connected second electrode strips 31. Moreover, the width of each first electrode strip 21 in the first electrode 20 may have a different value at a different position along the length direction of the first electrode strip 21, and the width of each second electrode strip 21 in the second electrode 30 may have a different value at a different position along the length direction of the second electrode strip 31. However, the distance S1 between the first electrode strip 21 and the neighboring second electrode strip 31 along a first direction at different positions may remain the same, and the distance S2 between the first electrode strip 21 and the neighboring second electrode strip 31 along a second direction at different positions may also remain the same.

Moreover, during the fabrication process, the CD bias may often lead to that the actual distance between the first electrode strip 21 and the second electrode 31 may not be consistent with the expected distance. However, as compared to an identical width of each first electrode strip or each second electrode at different positions in existing array substrate, the width of each first electrode strip 21 or each second electrode strip 31 according to the disclosed array substrate may have a different value at a different position. Therefore, electrode strips according to the present disclosure may have less impact on the transmission rate of the liquid crystals when CD bias appears. As such, the uniformity of the display brightness may be desired, and thus, the method used to arrange the electrode strips according to the present disclosure may improve the tolerance of CD bias during the fabrication process.

Returning back to FIG. 2A, the first direction and the second direction are optionally perpendicular to the length direction of the first electrode strips 21 and the second electrode strips 31.

Figure 5A:
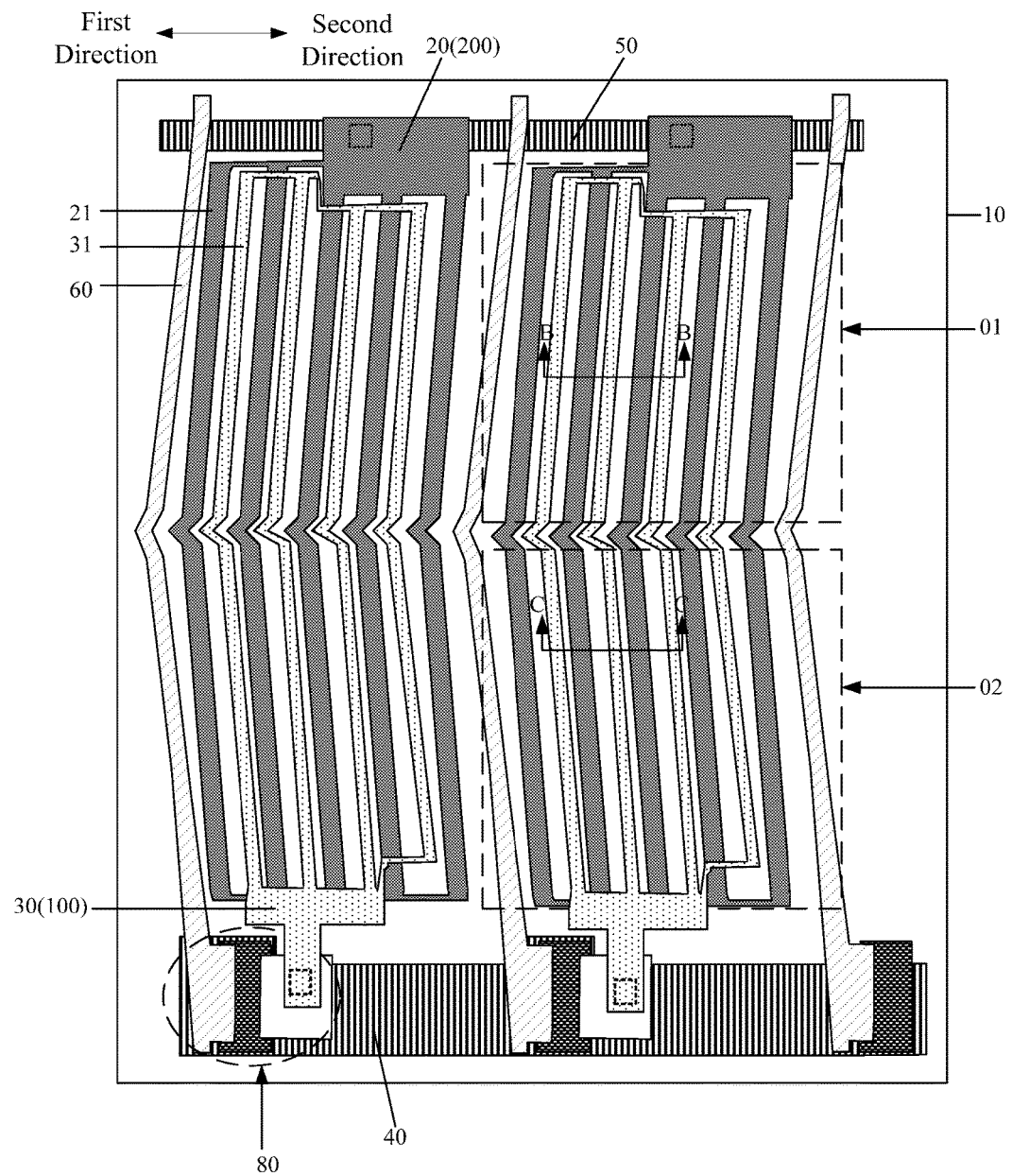
FIG. 5(a) illustrates a schematic view of another exemplary array substrate according to various disclosed embodiments.

FIG. 5(a) illustrates a schematic view of another exemplary array substrate according to various disclosed embodiments. Further, FIG. 5(b) illustrates a schematic cross-section view of the array substrate shown in FIG. 5(a) along a B-B line, and FIG. 5(c) illustrates a schematic cross-section view of the array substrate shown in FIG. 5(a) along a C-C line.

Figure 5B:
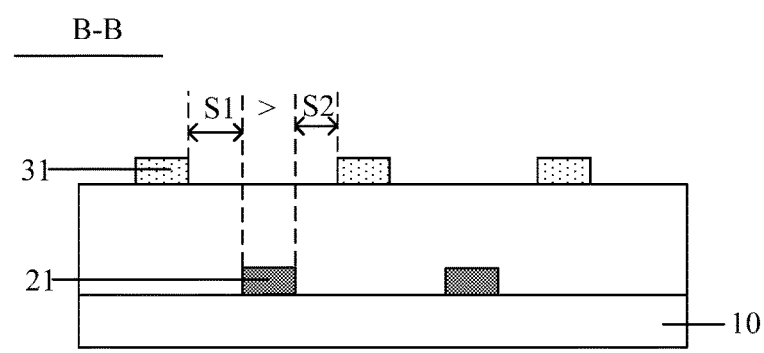
FIG. 5(b) illustrates a schematic cross-section view of the array substrate shown in FIG. 5(a) along a B-B line.
Figure 5C:
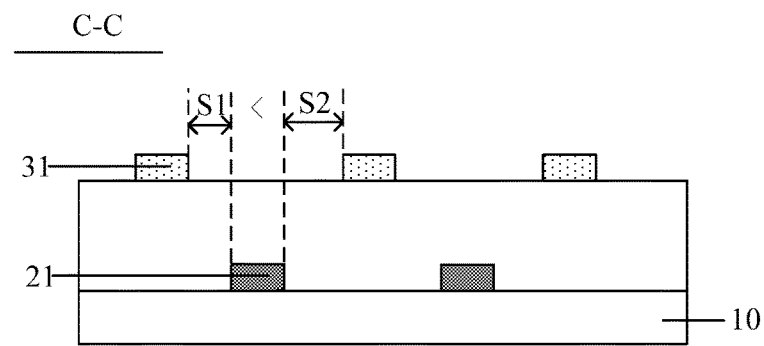
FIG. 5(c) illustrates a schematic cross-section view of the array substrate shown in FIG. 5(a) along a C-C line.

Referring to FIG. 5(a)-5(c), each subpixel may optionally include a first domain 01 and a second domain 02. Moreover, in the it domain 01, S1 may be larger than S2; while in the second domain 02, S1 may be smaller than S2.

Further, the length direction of each electrode strip in the first domain 01 may be the same, and the length direction of each electrode strip in the second domain 02 may also be the same. In addition, an angle between the length direction of the electrode strips in the first domain 01 and the length direction of the electrode strips in the second domain 02 may be greater than or equal to 0°, but smaller than or equal to 90°. For example, the range of the angle may be from 0° to approximately 15°, from approximately 15° to approximately 30°, from approximately 30° to approximately 45°, from approximately 45° to approximately 60°, or from approximately 60° to approximately 90°.

According to the disclosed array substrate, in each subpixel, S1 is greater than S2 in the first domain 01, but smaller than S2 in the second domain 02. Moreover, due to CD bias and/or overlap margin (i.e. the deviation of the actual separation distance between a first electrode strip 21 and a neighboring second electrode strip 31 from the expected separation distance), S1 and S2 may be changed during the fabrication process. When S1 and S2 are changed, in the first domain 01 and the second domain 02, one of the |S1-S2| values increases while the other decreases. Accordingly, in the first domain 01 and the second domain 02, one of the electric fields decreases, while the other increases. Therefore, the light beams coming out from a same subpixel may compensate each other through superimposition, and thus, the display brightness may demonstrate desired uniformity. Therefore, the present disclosure may further improve the tolerance of CD bias during the fabrication process, and also improve the tolerance of overlap margin.

Alternatively, for a portion of the first electrode strips 21 and the second electrode strips 31 in the first domain 01, S1 may be greater than S2, and for the rest portion of the first electrode strips 21 and the second electrode strips 31 in the first domain 01, S1 may be smaller than S2. Similarly, for a portion of the first electrode strips 21 and the second electrode strips 31 in the second domain 02, S1 may be greater than S2, and for the rest portion of the first electrode strips 21 and the second electrode strips 31 in the second domain 02, S1 may be smaller than S2.

That is, both situations: S1 greater than S2 and S1 smaller than S2 may appear in the first domain 01, and similarly, both situations: S1 greater than S2 and S1 smaller than S2 may also appear in the second domain 02.

Further, the length direction of each electrode strip in the first domain 01 may be the same, and the length direction of each electrode strip in the second domain 02 may also be the same. The angle between the length direction of the electrode strips in the first domain 01 the length direction of the electrode strips in the second domain 02 may be greater than or equal to 0°, but smaller than or equal to 90°.

According to the disclosed array substrate, when the first domain 01 and the second domain 02 both include the two situations: S1 greater than S2 and S1 smaller than S2, in each subpixel, the light beams coming out from each domain may compensate each other to a certain extent, and the light beams coming out from the two domain may then compensate each other, and thus the display brightness may demonstrate desired uniformity.

Figure 6:
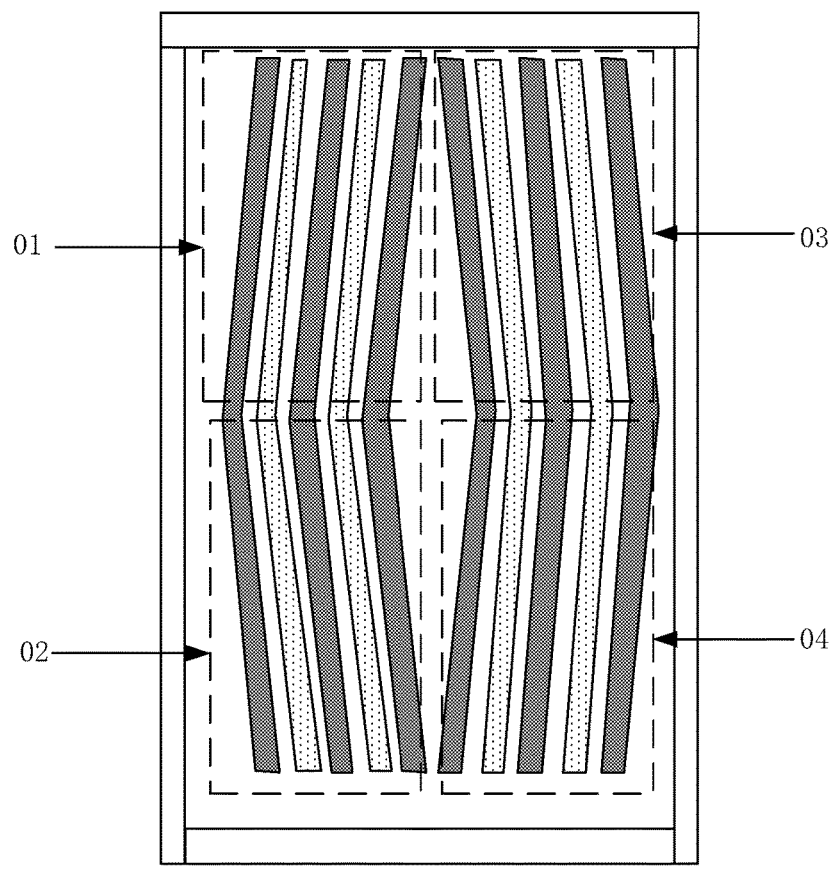
FIG. 6 illustrates a schematic diagram of pixel electrode strips formed by an exemplary method according to various disclosed embodiments.

FIG. 6 illustrates a schematic diagram of pixel electrode strips formed by an exemplary method according to various disclosed embodiments. Referring to FIG. 6, further, each subpixel may optionally include a third domain 03 which is mirror symmetrical to the first domain 01, and a fourth domain 04 which is mirror symmetrical to the second domain 02.

According to the disclosed array substrate, the domain structure in each subpixel may demonstrate a two-fold symmetry: along a vertical line through the center of the subpixel and also along a horizontal line through the center of the subpixel. As such, gray level inversion and color cast may be suppressed, and the product quality may thus be improved. In addition, the compensation results for the light beams coming out from each subpixel may be improved, and thus the uniformity of display brightness may be further improved.

Further, any neighboring subpixels may optionally include a first domain 01 and a second domain 02, respectively. In the first domain 01 of one of the two neighboring subpixels, S1 may be greater than S2, and in the second domain 02 of the other one of the two neighboring subpixels, S1 may be smaller than S2.

Alternatively, for a portion of the first electrode strips 21 and the second electrode strips 31 in the first domain 01, S1 may be greater than S2, and for the rest portion of the first electrode strips 21 and the second electrode strips 31 in the first domain 01, S1 may be smaller than S2. Similarly, for a portion of the first electrode strips 21 and the second electrode strips 31 in the second domain 02, S1 may be greater than S2, and for the rest portion of the first electrode strips 21 and the second electrode strips 31 in the second domain 02, S1 may be smaller than S2.

Similarly to the array substrate described above where each subpixel includes both the first domain 01 and the second domain 02, the disclosed array substrate may demonstrate the same effect in terms of improving the uniformity of the display brightness.

Further, when the two neighboring subpixels that include the first domain 01 and the second domain 02, respectively are used to display a same color with a same gray level, the mutual compensation effect of the first domain 01 and the second domain 02 may be further improved.

Further, in the first domain 01 and the second domain 02, the number of the first electrode strips 21 and the second electrode strips 31 with S1 greater than S2 may be optionally equal to the number of the first electrode strips 21 and the second electrode strips 31 with S1 smaller than S2.

That is, when the first domain 01 only includes electrode strips with S1 greater than S2, and the second domain 02 only includes electrode strips with S1 smaller than S2, the number of the first electrode strips 21 and the second electrode strips 31 in the first domain 01 may be the same as the number of the first electrode strips 21 and the second electrode strips 31 in the second domain 02.

Alternatively, when both situations, i.e. S1 greater than S2 and S1 smaller than S2, coexist in the first domain 01 and also in the second domain 02, the number of the first electrode strips 21 and the second electrode strips 31 in the first domain 01 with S1 greater than S2 may be the same as the number of the first electrode strips 21 and the second electrode strips 31 in the second domain 02 with S1 smaller than S2, and the number of the first electrode strips 21 and the second electrode strips 31 in the first domain 01 with S1 smaller than S2 may be the same as the number of the first electrode strips 21 and the second electrode strips 31 in the second domain 02 with S1 greater than S2.

According to the disclosed array substrate, by arranging the number of the first electrode strips 21 and the second electrode strips 31 with S1 greater than S2 equal to the number of the first electrode strips 21 and the second electrode strips 31 with S1 smaller than S2 in the first domain 01 and the second domain 02, the light beams coming out from the first domain 01 and the second domain 02 may be uniformly compensated. Therefore the uniformity of the light beams coming from each subpixel may be further improved, and thus the uniformity of display brightness may also be further improved.

Optionally, a base value M of the width of the first electrode strips 21 may be 3.1±0.5 μm. Along the length direction of the first electrode strips 21, the width of each first electrode strip 21 at different positions may vary in a range of M±0.5 μm. Moreover, a base value N of the width of the second electrode strips 31 may be 2.1±0.5 μm. Along the length direction of the second electrode strips 31, the width of each second electrode strip 31 at different positions may vary in a range of N±0.5 μm. Moreover, M may always be greater than N.

For example, the base value M may be one of 2.0 μm, 2.6 μm, 3.1 μm, 3.5 μm, 4.0 μm, and the base value N may be one of 1.6 μm, 2.1 μm, 2.5 μm, 3.0 μm, 3.6 μm, etc.

Further, the width of the first electrode strips 21 and the width of the second electrode strips 31 may be greater than or smaller than the corresponding base value by a value in a range of approximately 0.2 μm to approximately 0.5 μm.

Figure 7:
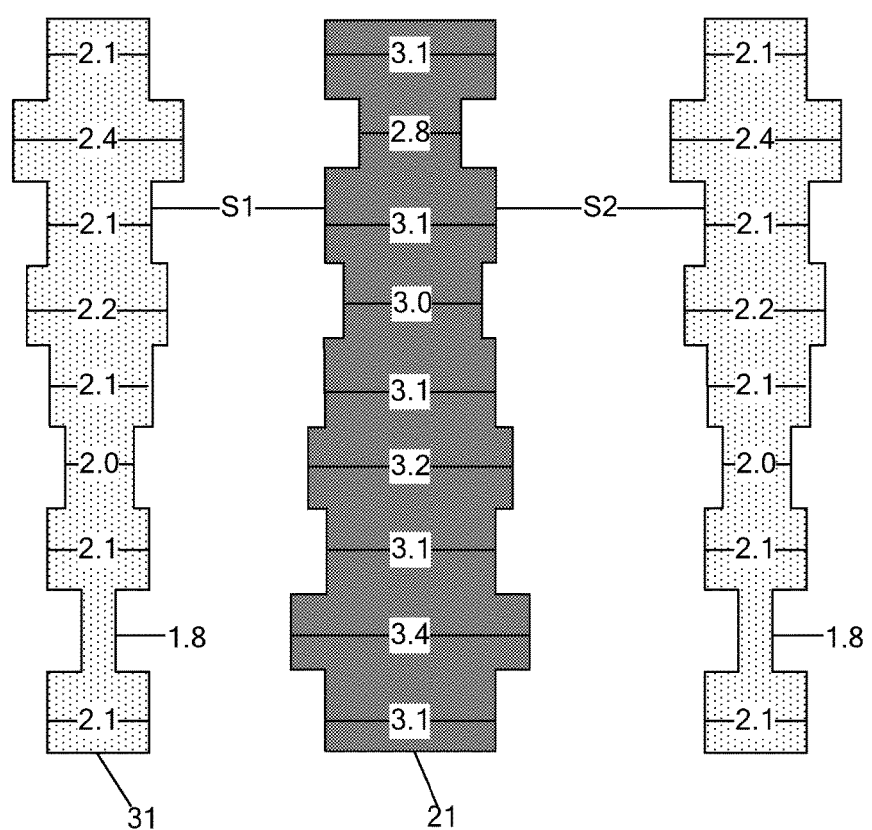
FIG. 7 illustrates a schematic diagram of an exemplary width of electrode strips according to various disclosed embodiments.

Specifically, as an example, FIG. 7 illustrates a schematic diagram of the electrode strips according to various disclosed embodiments. Referring to FIG. 7, the base value M of the width of the first electrode strips 21 may be 3.1 μm. Along the length direction of the first electrode strips 21, the width of each first electrode strip 21 at different positions may vary in a range of approximately M±0.3 μm. Moreover, the base value N of the width of the second electrode strips 31 may be 2.1 μm. Along the length direction of the second electrode strips 31, the width of each second electrode strip 31 at different positions may vary in a range of approximately N±0.3 μm. Further, in each domain, each first electrode strip 21 may be divided into 9 short segments with each having an identical length. The $1^{st}$, $3^{rd}$, $5^{th}$, $7^{th}$, and $9^{th}$ segments of the first electrode strip 21 may save a same width equal to the base value M, and the $2^{nd}$, $4^{th}$, $6^{th}$, and $8^{th}$ segments may have sequentially increased widths from M−0.3 μm with an increment of 0.2 μm. In addition, in each domain, each second electrode strip 31 may also be divided into 9 short segments with each having an identical length. The $1^{st}$, $3^{rd}$, $5^{th}$, $7^{th}$, and $9^{th}$ segments of the second electrode strip 31 may have a same width equal to the base value N, and the $2^{nd}$, $4^{th}$, $6^{th}$, and $8^{th}$ segments may have sequentially decreased widths from N+0.3 μm with a decrement of 0.2 μm.

Returning to FIG. 5(*a*), optionally, the first electrode 20 may be a common electrode 200, and the second electrode 30 may be a pixel electrode 100. The first electrode 20 may be connected to a common electrode line 50. The common electrode line 50 may be arranged in a same layer as a gate line 40 with the common electrode line 50 parallel to the gate line 40. The common electrode lines 50 and the gate lines 40 may be formed in a same, single process using a same material.

Figure 8A:
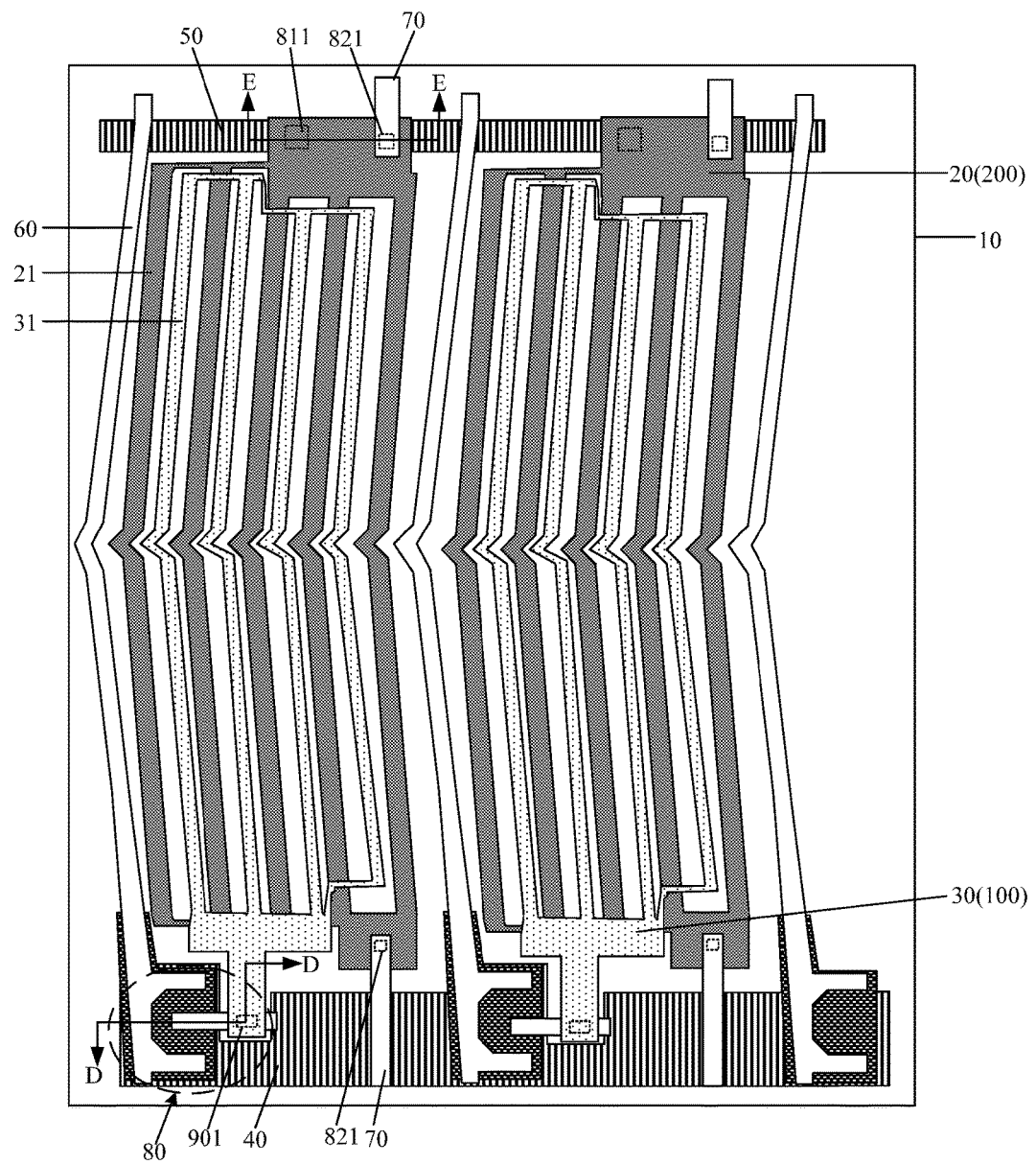
FIG. 8(a) illustrates a schematic view of another exemplary array substrate according to various disclosed embodiments.
Figure 8B:
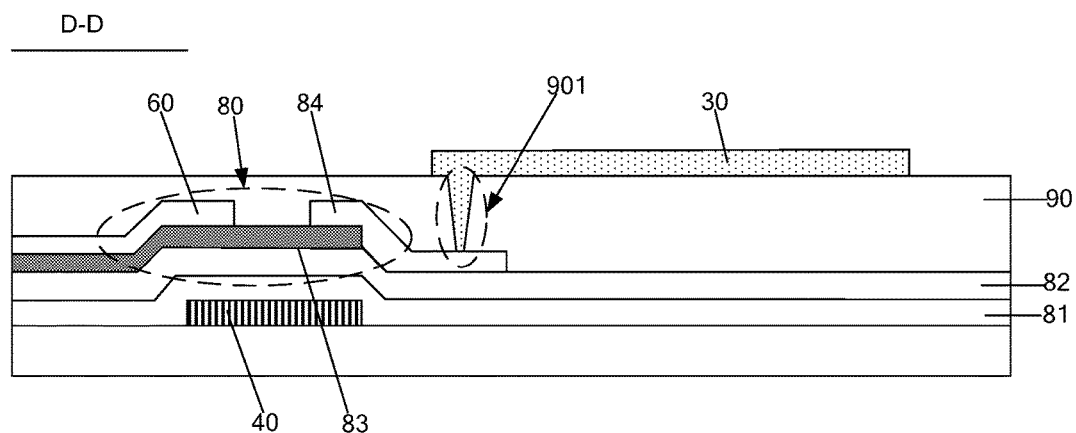
FIG. 8(b) illustrates a schematic cross-section view of the array substrate shown in FIG. 8(a) along a D-D line.
Figure 8C:
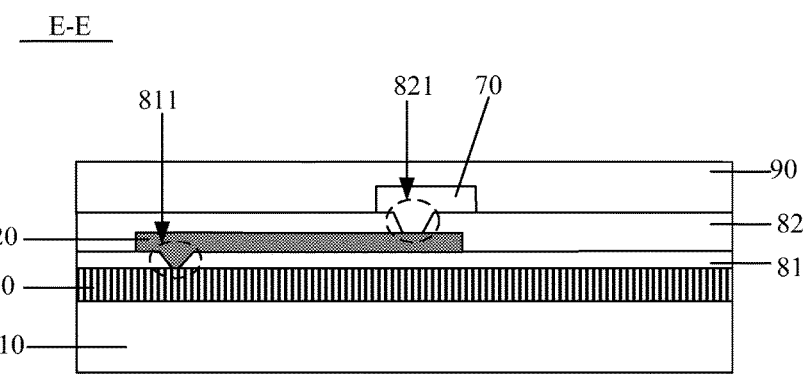
FIG. 8(c) illustrates a schematic cross-section view of the array substrate shown in FIG. 8(a) along an E-E line.

Further, referring to FIGS. 8(*a*)-8(*c*), each subpixel of the array substrate may also include an auxiliary metal line 70 in a same layer as the data line 60. The data lines 60 and the auxiliary metal lines 70 may be formed in a same, single process using a same material. The auxiliary metal line 70 may be electrically connected to the common electrode or the common electrode line 50. In one embodiment, the auxillary metal line 70 may be optionally parallel with the data line 60.

For example, first, a gate line 40 and a common electrode line 50 may be formed on the substrate 10. Then, a first isolation layer 81 may be formed, and a first electrode 20 (i.e. the common electrode 200) may be formed on the first isolation layer 81. The first electrode 20 may be electrically connected to the common electrode line 50 through a first via hole 811 formed in the first isolation layer 81. Further, a second isolation layer 82 may be formed, and a semiconductor layer 83, a data line 60, a drain electrode 84, and an auxiliary metal line 70 may be formed on the second isolation layer 82. The auxiliary metal line 70 may be electrically connected to the first electrode 20 through a second via hole 821 formed in the second isolation layer 82. A passivation layer 90 may then be formed, and a second electrode 30 (i.e. a pixel electrode 100) may be formed on the passivation layer 90. The second electrode 30 may be electrically connected to the drain electrode 84 through a third via hole 901 formed in the passivation layer 90.

The common electrode line 50 shown in FIG. 5(*a*) and FIG. 8(*a*) is formed at a position close to the edge of the subpixel. In other embodiments, the common electrode line 50 may be formed at any appropriate position in the subpixel.

According to the disclosed array substrate, by arranging the common electrode lines 50 parallel to the gate lines 40, and the auxiliary metal 70 parallel to the data lines 60, all the common electrode lines 50 and all the auxiliary metal lines 70 may together form a network structure. The network structure may be electrically connected to the common electrodes such that the resistance of the common electrodes may demonstrate desired uniformity. Therefore, problems such as greenish picture, display flicker, etc. caused by non-uniform resistance of the common electrodes may be reduced, and the display quality may thus be improved. Moreover, by arranging the data lines 60 and the auxiliary metal lines 70 into a same layer, the number of processing steps may be reduced, and thus the fabrication process may be simplified.

The array substrate may optionally include, a plurality of TFTs 80. As shown in FIG. 8(*a*), the plurality of TFTs 80 may be U-type TFTs.

According to the disclosed array substrate, by arranging U-type TFTs, the TFTs 80 may have a desired width to length ratio and the pixel aperture ratio is also ensured. As such, the TFTs 80 may demonstrate desired charging ability and the display quality may be improved.

Further, the present disclosure provides a display panel, the display panel may include the array substrate described above. Further, the display panel may also include a counter substrate corresponding to the array substrate.

Further, a display device may include the display panel, and thus include the array substrate described above. The display device may be a LCD device. Specifically, the display device may be a LCD monitor, a LCD television, a digital photo frame, a cellphone, a tablet computer, or any other appropriate product or component having a display function.

The present disclosure also provides a method for fabricating an array substrate. Referring to FIG. 2A, the army substrate may include a plurality of subpixels. The subpixel may include a first electrode 20 and a second electrode 30 disposed on a substrate 10. The first electrode 20 may be electrically isolated from the second electrode 30. The first electrode 20 may further include a plurality of first electrode strips 21 and the second electrode 30 may include a plurality of second electrode strips 31. When being orthographically projected on the substrate 10, the plurality of first electrode strips 21 and the plurality of second electrode strips 31 may be alternately arranged and in parallel with each other. Further, the distance between each first electrode strip 21 and the neighboring second electrode strip 31 along a first direction may be S1 at any position; and the distance between each first electrode strip 21 and the neighboring second electrode strip 31 along a second direction may be S2 at any position.

The first direction and the second direction may be two opposite directions. Along the length direction of the first electrode strips 21, the width of each first electrode strip 21 may have different values at different positions. Also, along the length direction of the second electrode strips 31, the width of each second electrode strip 31 may have different values at different positions.

According to the disclosed method for fabricating the array substrate, each first electrode 20 of the array substrate may include a plurality of electrically connected first electrode strips 21, and each second electrode 30 of the array substrate may include a plurality of electrically connected second electrode strips 31. Moreover, the width of each first electrode strip 21 in the first electrode 20 may have a different value at a different position along the length direction of the first electrode strip 21, and the width of each second electrode strip 21 in the second electrode 30 may have a different value at a different position along the length direction of the second electrode strip 31. However, the distance S1 between the first electrode strip 21 and the neighboring second electrode strip 31 along a first direction at different positions may remain the same, and the distance S2 between the first electrode strip 21 and the neighboring second electrode strip 31 along a second direction at different positions may also remain the same.

Moreover, during the fabrication process, the CD bias may often lead to that the actual distance between the first electrode strip 21 and the second electrode 31 may not be consistent with the expected distance. However, as compared to an identical width of each first electrode strip or each second electrode at different positions in existing array substrate, the width of each first electrode strip 21 or each second electrode strip 31 according to the disclosed array substrate may have a different value at a different position. Therefore, electrode strips according to the present disclosure may have less impact on the transmission rate of the liquid crystals when CD bias appears. As such, the uniformity of the display brightness may be desired, and thus, the method used to arrange the electrode strips according to the present disclosure may improve the tolerance of CD bias during the fabrication process.

Referring to FIG. 8(a), optionally, the first electrode 20 may be a common electrode, the second electrode 30 may be a pixel electrode. The fabrication method may further include forming a gate line 40, a common electrode line 50 in a same layer with the gate line 40, a data line 60, an auxiliary metal line 70 in a same layer with the data line 60. The common electrode may be electrically connected to both the common electrode line 50 and the auxiliary metal line 70.

Figure 9:
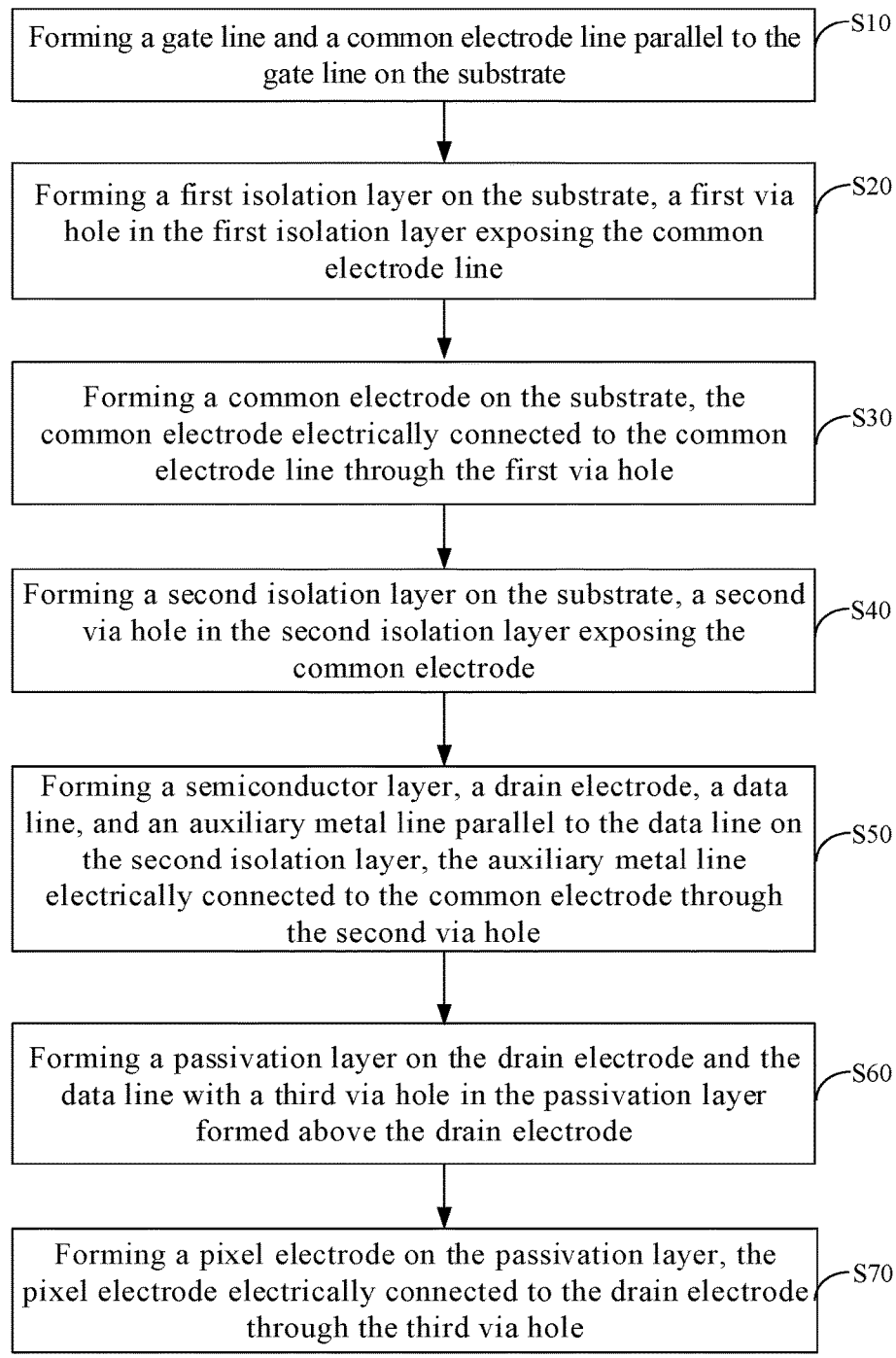
FIG. 9 illustrates a flow chart of an exemplary fabrication method for an array substrate according to various disclosed embodiments.

FIG. 9 illustrates a flow chart of an exemplary fabrication method for an array substrate according to various disclosed embodiments. Referring to FIG. 9, the fabrication method includes the following steps.

In S10: A gate line 40 and a common electrode line 50 parallel to the gate line 40 may be formed on the substrate 10.

In S20: After forming the gate line 40 and the common electrode line 50, a first isolation layer 81 may be formed on the substrate 10. A first via hole 811 exposing the common electrode line 50 may be formed in the first isolation layer 81.

In S30: After forming the first isolation layer 81, a common electrode 200 may be formed on the substrate 10. The common electrode 200 may be electrically connected to the common electrode line 50 through the first is hole 811.

In S40: After forming the common electrode 200, a second isolation layer 82 may be formed on the substrate 10.

A second via hole 821 exposing the common electrode 200 may be formed in the second isolation layer 82.

In S50: After forming the second isolation layer 82 on the substrate 10, a semiconductor layer 83, a drain electrode 84, a data line 60, an auxiliary metal line 70 parallel to the data line 60 may be formed. The auxiliary metal line 70 may be electrically connected to the common electrode 200 through the second via hole 821.

In S60: After forming the drain electrode 84, the data line 60, a passivation layer 90 may be formed on the substrate 10. A third via hole 901 may be formed in the passivation layer 90 above the drain electrode 84 to expose at least a portion of the drain electrode 84.

In S70: After forming the passivation layer 90 on the substrate 90, a pixel electrode 100 may be formed. The pixel electrode 100 may be electrically connected to the drain electrode 84 through the third via hole 901.

The above fabrication process is described based on the fabrication of one subpixel of the array substrate. In actual fabrication process, a plurality of subpixels may be simultaneously fabricated. The plurality of subpixels may together firm the array substrate as disclosed in the present disclosure.

According to the disclosed array substrate, by arranging the common electrode lines 50 parallel to the gate lines 40, and the auxiliary metal lines 70 parallel to the data lines 60, all the common electrode lines 50 and all the auxiliary metal lines 70 may together form a network structure. The network structure may be electrically connected to the common electrodes such that the resistance of the common electrodes may demonstrate desired uniformity. Therefore, problems such as greenish picture, display flicker, etc. caused by non-uniform resistance of the common electrodes may be reduced, and the display quality may thus be improved. Moreover, by arranging the data lines 60 and the auxiliary metal lines 70 into a same layer, the number of processing steps may be reduced, and thus the fabrication process may be simplified.

According to the disclosed array substrate, fabrication method, and display panel, the array substrate may include a plurality of first electrodes and a plurality of second electrodes. Further, each first electrode of the array substrate may include a plurality of electrically connected first electrode strips, and each second electrode of the array substrate may include a plurality of electrically connected second electrode strips. Moreover, the width of each first electrode strip in the first electrode may have a different value at a different position along the length direction of the first electrode strip, and the width of each second electrode strip in the second electrode may also have a different value at a different position along the length direction of the second electrode strip. However, the distance between the first electrode strip and the neighboring second electrode strip along a first direction at different positions may remain the same, and the distance between the first electrode strip and the neighboring second electrode strip along a second direction at different positions may also remain the same.

Moreover, during the fabrication process, the CD bias may often lead to that the actual distance between the first electrode strip and the second electrode may not be consistent with the expected distance. However, as compared to an identical width of each first electrode strip or each second electrode at different positions in existing array substrate, the width of each first electrode strip or each second electrode strip according to the disclosed array substrate may have a different value at a different position. Therefore, electrode strips according to the present disclosure may have less impact on the transmission rate of the liquid crystals when CD bias appears. As such, the uniformity of the display brightness may be desired, and thus, the method used to arrange the electrode strips according to the present disclosure may improve the tolerance of CD bias during the fabrication process.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated.

It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to embodiments of the disclosure.

It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. An array substrate, comprising:
    a plurality of subpixels, a respective one of which including a first electrode and a second electrode, electrically isolated from one another, on a substrate, wherein:
        the first electrode includes a plurality of electrically connected first electrode strips;
        the second electrode includes a plurality of electrically connected second electrode strips;
        the plurality of electrically connected first electrode strips and the plurality of electrically connected second electrode strips are alternately arranged;
        a first distance along a first direction at any position between one first electrode strip and a first neighboring second electrode strip is substantially same, and a second distance along a second direction, opposite to the first direction, at any position between the one first electrode strip and a second neighboring second electrode strip is substantially same;
        along a length direction of the first electrode strips, a first width of a respective one of the first electrode strips is irregularly varied, and along a length direction of the plurality of electrically connected second electrode strips, a second width of a respective one of the plurality of electrically connected second electrode strips is irregularly varied;
        the first width of the respective one of the first electrode strips includes a first base value M, and along the length direction of the respective one of the first electrode strips, the first width includes the first base value M plus a first deviation range;
        the second width of the respective one of the plurality of electrically connected second electrode strips includes a second base value N, and along the length direction of the respective one of the plurality of electrically connected second electrode strips, the second width includes the second base value N plus a second deviation range;
        the respective one of the first electrode strips is divided into a plurality of first segments with each having a same length, wherein odd-numbered first segments of the first electrode strip have a same width equal to the first base value M, and widths of even-numbered first segments are sequentially increased by 0.2 µm starting from (M−0.3) µm; and
        the respective one of the plurality of electrically connected second electrode strips is divided into a plurality of second segments with each having a same length, wherein odd-numbered second segments of the plurality of electrically connected second electrode strips have a same width equal to the second base value N, and widths of even-numbered second segments are sequentially decreased by 0.2 µm starting from (N+0.3) µm.

2. The array substrate of claim 1, wherein:
    the first width of the respective one of the plurality of electrically connected first electrode strips includes a first base value M in a range of approximately 3.1±1.5 µm, and along the length direction of the respective one of the plurality of electrically connected first electrode strips, the first width irregularly varies in a range within M±0.5 µm;
    the second width of the respective one of the plurality of electrically connected second electrode strips includes a second base value N in a range of approximately 2.1±0.5 µm, and along the length direction of the respective one of the plurality of electrically connected second electrode strips, the second width irregularly varies in a range N±0.5 µm; and
    the first base value M is greater than the second base value N.

3. The array substrate of claim 2, wherein:
    the first base value M is 3.1 µm, and along the length direction of the first electrode strip, the first width irregularly varies in a range within (3.1±0.3) µm; and
    the second base value N is 2.1 µm, and along the length direction of the plurality of electrically connected second electrode strips, the second width irregularly varies in a range within (2.1±0.3) µm, wherein:
        the respective one of the plurality of electrically connected first electrode strips is divided into 9 segments with each having a same length, wherein the $1^{st}$, $3^{rd}$, $5^{th}$, $7^{th}$, and $9^{th}$ segments of the first electrode strip have a same width equal to the first base value M, and widths of the $2^{nd}$, $4^{th}$, $6^{th}$, and $8^{th}$ segments are sequentially increased by 0.2 µm starting from (M−0.3) µm; and the respective one of the plurality of electrically connected second electrode strips is divided into 9 segments with each having a same length, wherein the $1^{st}$, $3^{rd}$, $5^{th}$, $7^{th}$, and $9^{th}$ segments of the plurality of electrically connected second electrode strips have a same width equal to the second base value N, and widths of the $2^{nd}$, $4^{th}$, $6^{th}$, and $8^{th}$ segments are sequentially decreased by 0.2 µm starting from (N+0.3) µm.

4. The array substrate of claim 1, wherein:
each of the first direction and the second direction is perpendicular to the length direction of the plurality of electrically connected first electrode strips.

5. The array substrate of claim 1, wherein:
a respective one of the plurality of subpixels includes a first domain and a second domain.

6. The array substrate of claim 5, wherein:
in the first domain, the first distance is greater than the second distance, and
in the second domain, the first distance is smaller than the second distance.

7. The array substrate of claim 5, wherein:
in the first domain, for a portion of plurality of electrically connected the first electrode strips and the plurality of electrically connected second electrode strips, the first distance is greater than the second distance, and for a rest portion of the plurality of electrically connected first electrode strips and the plurality of electrically connected second electrode strips, the first distance is smaller than the second distance, and
in the second domain, for a portion of the plurality of electrically connected first electrode strips and the plurality of electrically connected second electrode strips, the first distance is greater than the second distance, and for a rest portion of the plurality of electrically connected first electrode strips and the plurality of electrically connected second electrode strips, the first distance is smaller than the second distance.

8. The array substrate of claim 5, wherein:
the respective one of the plurality of subpixels further includes:
a third domain mirror symmetrical to the first domain, and
a fourth domain mirror symmetrical to the second domain.

9. The array substrate of claim 5, wherein:
in the first domain and the second domain, a number of the plurality of electrically connected first electrode strips and the plurality of electrically connected second electrode strips with the first distance greater than the second distance is equal to a number of the plurality of electrically connected first electrode strips and the plurality of electrically connected second electrode strips with the first distance smaller than the second distance.

10. The array substrate of claim 1, wherein:
any neighboring subpixels include a first domain and a second domain, respectively; and
in the first domain, the first distance is greater than the second distance, and in the second domain, the first distance is smaller than the second distance.

11. The array substrate of claim 1, wherein:
any neighboring subpixels include a first domain and a second domain, respectively; and
in the first domain, for a portion of the plurality of electrically connected first electrode strips and the plurality of electrically connected second electrode strips, the first distance is greater than the second distance, and for a rest portion of the plurality of electrically connected first electrode strips and the plurality of electrically connected second electrode strips, the first distance is smaller than the second distance, and
in the second domain, for a portion of the plurality of electrically connected first electrode strips and the plurality of electrically connected second electrode strips, the first distance is greater than the second distance, and for a rest portion of the plurality of electrically connected first electrode strips and the plurality of electrically connected second electrode strips, the first distance is smaller than the second distance.

12. The array substrate of claim 10, wherein:
in the first domain and the second domain, a number of the plurality of electrically connected first electrode strips and the plurality of electrically connected second electrode strips with the first distance greater than the second distance is equal to a number of the plurality of electrically connected first electrode strips and the plurality of electrically connected second electrode strips with the first distance smaller than the second distance.

13. A display panel comprising the array substrate of claim 1.

14. A display device comprising the display panel of claim 13.

15. A method for fabricating an array substrate, comprising:
forming a plurality of subpixels, a respective one of which including a first electrode and a second electrode, electrically isolated from each other, on a substrate, wherein:
the first electrode includes a plurality of electrically connected first electrode strips;
the second electrode includes a plurality of electrically connected second electrode strips;
the plurality of electrically connected first electrode strips and the plurality of electrically connected second electrode strips are alternately arranged;
a first distance S1 along a first direction at any position between one first electrode strip and a first neighboring second electrode strip is substantially same, and a second distance S2 along a second direction, opposite to the first direction, at any position between the one first electrode strip and a second neighboring second electrode strip is substantially same;
along a length direction of the first electrode strips, a first width of a respective one of the first electrode strips is irregularly varied, and along a length direction of the plurality of electrically connected second electrode strips, a second width of a respective one of the plurality of electrically connected second electrode strips is irregularly varied;
the first width of the respective one of the first electrode strips includes a first base value M, and along the length direction of the respective one of the first electrode strips, the first width includes the first base value M plus a first deviation range;
the second width of the respective one of the plurality of electrically connected second electrode strips includes a second base value N, and along the length direction of the respective one of the plurality of electrically connected second electrode strips, the second width includes the second base value N plus a second deviation range;

the respective one of the first electrode strips is divided into a plurality of first segments with each having a same length, wherein odd-numbered first segments of the first electrode strip have a same width equal to the first base value M, and widths of even-numbered first segments are sequentially increased by 0.2 μm starting from (M−0.3) μm; and the respective one of the plurality of electrically connected second electrode strips is divided into a plurality of second segments with each having a same length, wherein odd-numbered second segments of the plurality of electrically connected second electrode strips have a same width equal to the second base value N, and widths of even-numbered second segments are sequentially decreased by 0.2 μm starting from (N+0.3) μm.

16. The method of claim 15, wherein:
the first width of the respective one of the plurality of electrically connected first electrode strips includes a first base value M, and along the length direction of the respective one of the plurality of electrically connected first electrode strips, the first width includes the first base value M plus a first deviation range; and
the second width of the respective one of the plurality of electrically connected second electrode strips includes a second base value N, and along the length direction of the respective one of the plurality of electrically connected second electrode strips, the second width includes the second base value N plus a second deviation range.

17. The method of claim 15, wherein:
the first electrode is a common electrode and the second electrode is a pixel electrode.

18. The method of claim 17, further including:
forming a gate line, a common electrode line in a same layer as the gate line, a data line, and an auxiliary metal line in a same layer as the data line for a respective one of the plurality of subpixels, wherein the common electrode is electrically connected to the common electrode line and the auxiliary metal line.

19. The method of claim 18, wherein forming the gate line, the common electrode line, the data line, the auxiliary metal line, the common electrode, and the pixel electrode further includes:
forming the gate line and the common electrode line parallel to the gate line on the substrate;
forming a first isolation layer with a first via hole exposing the common electrode line on the substrate;
forming the common electrode on the first isolation layer, wherein the common electrode is electrically connected to the common electrode line through the first via hole formed in the first isolation layer;
forming a second isolation layer with a second via hole exposing the common electrode on the substrate;
forming a semiconductor layer and a drain electrode as well as the data line and the auxiliary metal line parallel to the data line on the second isolation layer, wherein the auxiliary metal line is electrically connected to the common electrode through the second via hole formed in the second isolation layer;
forming a passivation layer with a third via hole above the drain electrode; and
forming the pixel electrode on the passivation layer, wherein the pixel electrode is electrically connected to the drain electrode through the third via hole formed in the passivation layer.

* * * * *